United States Patent
Kukreja et al.

(10) Patent No.: US 8,504,886 B2
(45) Date of Patent: Aug. 6, 2013

(54) METHOD FOR PARTITIONING SCAN CHAIN

(75) Inventors: Himanshu Kukreja, New Delhi (IN); Deepak Agrawal, Ghaziabad (IN)

(73) Assignee: Freescale Semiconductor, Inc., Austin, TX (US)

( * ) Notice: Subject to any disclaimer, the term of this patent is extended or adjusted under 35 U.S.C. 154(b) by 130 days.

(21) Appl. No.: 13/191,456

(22) Filed: Jul. 27, 2011

(65) Prior Publication Data

US 2013/0031433 A1 Jan. 31, 2013

(51) Int. Cl.
*G01R 31/28* (2006.01)

(52) U.S. Cl.
USPC .......................... 714/729; 714/727; 714/732

(58) Field of Classification Search
USPC ............... 714/729, 727, 726, 732, 738, 734, 714/733, 737
See application file for complete search history.

(56) References Cited

U.S. PATENT DOCUMENTS

| | | | |
|---|---|---|---|
| 5,889,788 A * | 3/1999 | Pressly et al. | 714/726 |
| 6,370,664 B1 | 4/2002 | Bhawmik | |
| 6,496,966 B1 | 12/2002 | Barney | |
| 6,681,356 B1 | 1/2004 | Gerowitz | |
| 7,017,095 B2 * | 3/2006 | Forlenza et al. | 714/738 |
| 7,058,869 B2 * | 6/2006 | Abdel-Hafez et al. | 714/729 |
| 7,464,311 B2 * | 12/2008 | Larson et al. | 714/727 |
| 7,539,915 B1 | 5/2009 | Solt | |

* cited by examiner

*Primary Examiner* — Fritz Alphonse
(74) *Attorney, Agent, or Firm* — Charles Bergere

(57) ABSTRACT

A system and method for scan partitioning for testing an embedded logic circuit in an integrated circuit (IC) device is provided. One or more scan partitions in the embedded logic circuit are identified. Each scan partition includes one or more scan chains of scan registers. One or more interacting registers connecting scan registers of a first scan partition and scan registers of a second scan partition are identified and combined to form an interacting scan chain. The embedded logic circuit is tested by selectively activating the scan chains of the first and second scan partitions and the interacting scan chain.

5 Claims, 5 Drawing Sheets

METHOD FOR PARTITIONING SCAN CHAIN

BACKGROUND OF THE INVENTION

The present invention relates to a method and system for testing of Integrated Circuit (IC) devices and more particularly to an enhanced scan partition methodology for testing embedded logic circuits in an IC device.

With the increase in complexity of IC devices, the complexity in testing these devices has also increased. IC devices include one or more embedded logic circuits, each of which needs to be tested for factors such as input and output timing compliance, frequency compliance, path delay faults, connection faults and various types of manufacturing faults. Further, the density of embedded logic circuits designed on IC devices has increased significantly, which has impacted the implementation of test circuits, which require additional chip area. In addition, the embedded logic circuits are sometimes surrounded by various peripheral and I/O circuits, making it difficult to include additional test circuits and making some of the input/output (I/O) terminals of the embedded logic circuits inaccessible by the test circuitry. Further, multiple embedded logic circuits may be integrated on the same IC device, further increasing the complexity of the system. Thus, simple connectivity testing is no longer adequate.

In recent years, scan partitioning has been used for testing embedded logic circuits, including SoC (System on Chip) designs. During testing, the embedded logic circuit being tested is operated in a test mode. In the test mode, the internal connections between the logic devices (such as flip-flops) of the embedded logic circuit are different from their connections in a functional mode. A conventional method of testing the embedded logic circuits of the IC device by scan partitioning is by using scan wrappers. A scan wrapper is a logic circuit that includes a plurality of flip-flops and one or more multiplexers. This allows access and hence the testing of otherwise inaccessible terminals/ports of the internal logic devices/flip-flops of the embedded logic circuits of the IC device.

FIG. 1 is a block diagram illustrating a conventional IC device 100 including circuitry for testing an embedded logic circuit using scan wrappers. The IC device 100 includes a plurality of logic devices 102a, 102b, 102c, . . . , 102i (collectively 102) and a plurality of scan registers 104a, 104b, . . . , 104l (collectively 104) that are combined to form an embedded logic circuit of the IC device 100. To facilitate testing of the embedded logic circuit, two scan partitions A and B are identified to independently test the logic devices 102 in each of the scan partitions A and B. The scan registers 104 are used for testing the embedded logic circuit formed by the logic devices 102. Two or more of the scan registers 104 are stitched into a scan chain such that each of the scan partitions A and B includes a plurality of scan chains. The scan partition A includes scan chains 1 and 2. Similarly, scan partition B includes scan chains 3 and 4. A logic data input S1 provides functional data to the first scan register (Mux D flip-flop) 104a and a logic data output S4 provides a functional data output of a functional path. Similarly, logic data inputs S2 and S3 provide functional data to the scan registers 104b and 104c and the logic data outputs S5 and S6 provide functional data outputs of their respective functional paths. The scan registers 104 are connected in a scan chain such that the output of a scan register is connected to the scan input of the next register and so on. As illustrated in FIG. 1, a scan data input I1 provides input scan data to a scan register 104a of the scan chain 1 and a scan data output O1 provides scan data out from the last scan register 104c of the scan chain 1. The output of the scan register 104a is the scan input for the next scan register 104b and so on. Similarly, scan data inputs I2, I4, and I5 provide input scan data to the scan registers 104g and 104j and scan data outputs O2, O4, and O5 provide scan data out from the last scan registers 104f, 104i, and 104l of their respective scan chains. The output ports of the scan registers of a scan chain of the scan partition A are connected with the input ports the scan registers of a scan chain of the scan partition B through a plurality of scan wrappers 106a, 106b, . . . , 106c (collectively 106) such that no node goes untested. In accordance with the conventional method of testing using scan wrappers, the scan wrappers 106 are active only when the IC device 100 is in the test mode. During the functional mode, the scan wrappers are inactive.

There are various disadvantages of using scan wrappers for testing the embedded logic circuit of the IC device 100, such as loss of transition coverage across partitions, area overhead due to additional and redundant logic, false yield loss on the scan wrapper chain, and implementation complexities in logical integration. FIG. 1 illustrates one of the disadvantages associated with the loss of transition coverage during at-speed test due to a redundant logic associated with scan wrappers 106. A test path 108 associated with the circuitry tested by the scan wrapper 106b during at-speed test of the circuitry at the interface of scan partition A and scan partition B is shown. Similar test paths are associated with the other scan wrappers 106a and 106c. FIG. 1 also illustrates a functional path 110 between the scan partitions A and B. As depicted in FIG. 1, there is a loss of transition coverage when the scan wrapper is implemented for testing the transition path between scan partitions A and B.

In view of the foregoing, it would be desirable to provide an IC device in which the embedded logic circuits can be tested with complete transition coverage across partitions. Further, it would be desirable that the IC device be tested for any manufacturing-induced defects that prevent proper functioning of the logical components or prevent compliance with functional timing specifications. In addition, the IC device should not have additional area overhead due to redundant logic of the scan wrappers. The logical implementation of the test circuit should have reduced complexity and the IC device should not have additional delay when the embedded logic circuit operates in the functional mode.

BRIEF DESCRIPTION OF THE DRAWINGS

The following description of the preferred embodiments of the present invention will be better understood when read in conjunction with the appended drawings. The present invention is illustrated by way of example, and not limited by the accompanying figures, in which like references indicate similar elements.

DETAILED DESCRIPTION OF THE INVENTION

Figure 1:
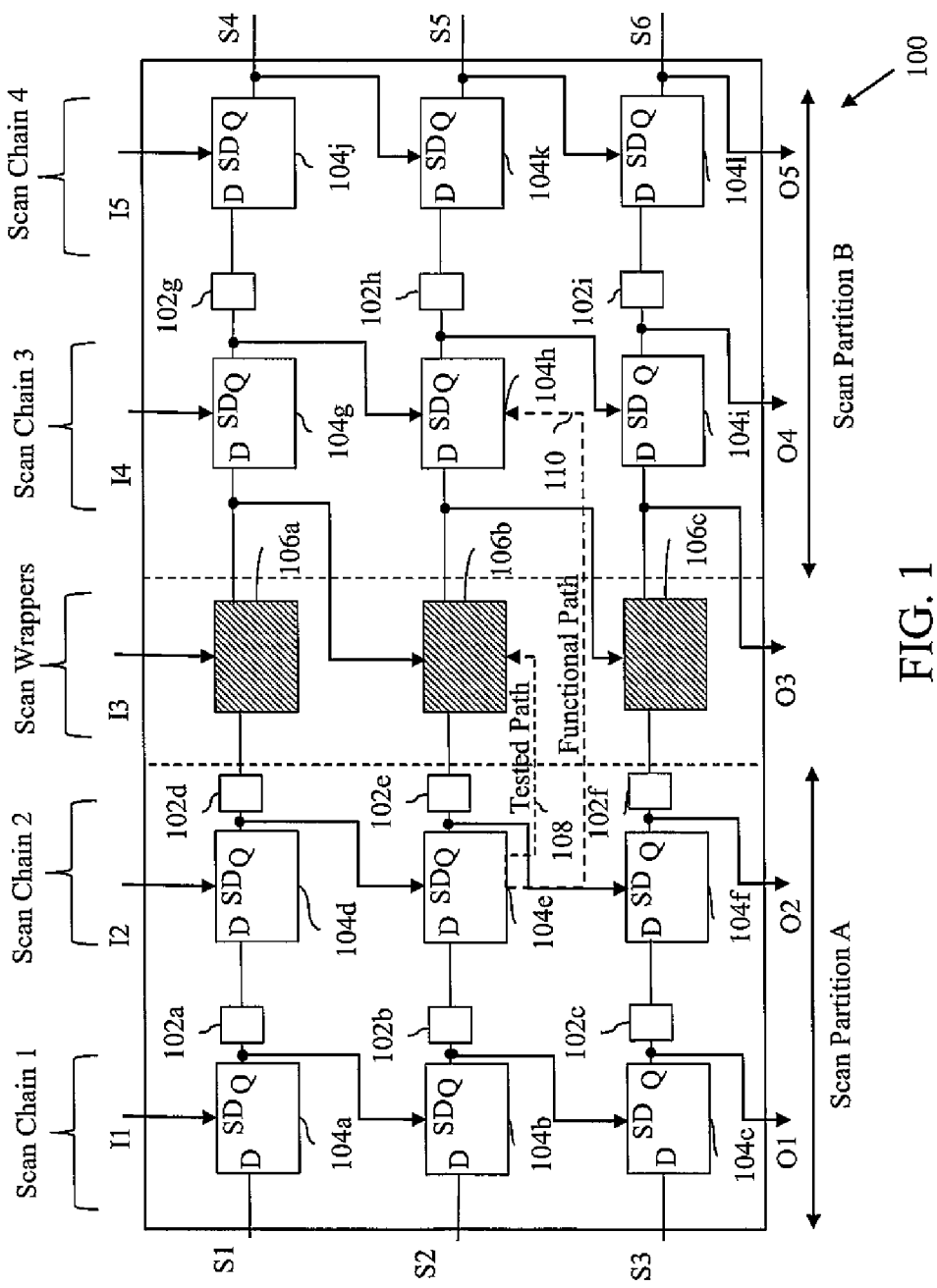
FIG. 1 is a block diagram illustrating a conventional integrated circuit (IC) device with circuitry for testing an embedded logic circuit using scan wrappers.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In an embodiment of the present invention, a method for testing an embedded logic circuit and a plurality of scan registers in an integrated circuit (IC) device by using scan partitioning is provided. The embedded logic circuit is tested by dividing it into two or more scan partitions such that each scan partition includes a plurality of scan registers and a plurality of logic devices. One or more scan registers of the plurality of scan registers of a scan partition are stitched together to form one or more scan chains in each scan partition. A plurality of interacting scan registers that interact with a scan register of a first scan partition and a scan register of a second scan partition are identified. The interacting scan registers are stitched together to form an interacting scan chain. The embedded logic circuit, the scan registers and the interacting scan registers are tested using scan partitioning. This is done by selectively activating the scan chains of the first scan partition, the scan chains of the second partition and the interacting scan chain.

In accordance with an embodiment of the present invention, testing of the logic devices and the scan registers of the first scan partition is performed by activating the scan chains of the first scan partition and the interacting scan chain during a first time period. Further, the testing for the logic devices and the scan registers of the second scan partition and the interacting scan registers is performed by activating the scan chains of the second scan partition and the interacting scan chain during a second time period.

In another embodiment of the present invention, an IC device that includes an embedded logic circuit is provided such that the IC device allows for the testing of the embedded logic circuit and the scan registers by scan partitioning. The embedded logic circuit includes two or more scan partitions, where each scan partition includes one or more scan chains. Each scan chain is a combination of a plurality of scan registers that are stitched together. The embedded logic circuit further includes a plurality of interacting scan registers that interact with a plurality of scan registers of the first scan partition and a plurality of scan registers of the second scan partition through none or more logic devices. The plurality of interacting scan registers are stitched together to form an interacting scan chain.

The method and the system described above have a number of advantages. Scan partitioning provides an advantage where less I/O ports are available for testing in an embedded logic circuit. Further, it helps in avoiding long simulation run time that occurs due to huge Silicon on Chip (SoC) sizes. Moreover, the scan partitioning methodology also helps in avoiding the problems in testing associated with the integration of third-party Intellectual Properties (IPs). The method and system for scan partitioning discussed above eliminates the use of a redundant logic block of scan wrapper without having any impact on the test quality, functional path timing, and area of the IC device. Further, the methodology provides an enhanced test quality, especially in complex SoC devices, resulting in reduced test escapes. This is also useful in high-speed designs for implementing scan partitioning since there is no additional logic in functional path. Moreover, coverage loss between the two or more scan partitions is avoided and hence true transition coverage can be achieved while eliminating an additional logic.

Figure 2:
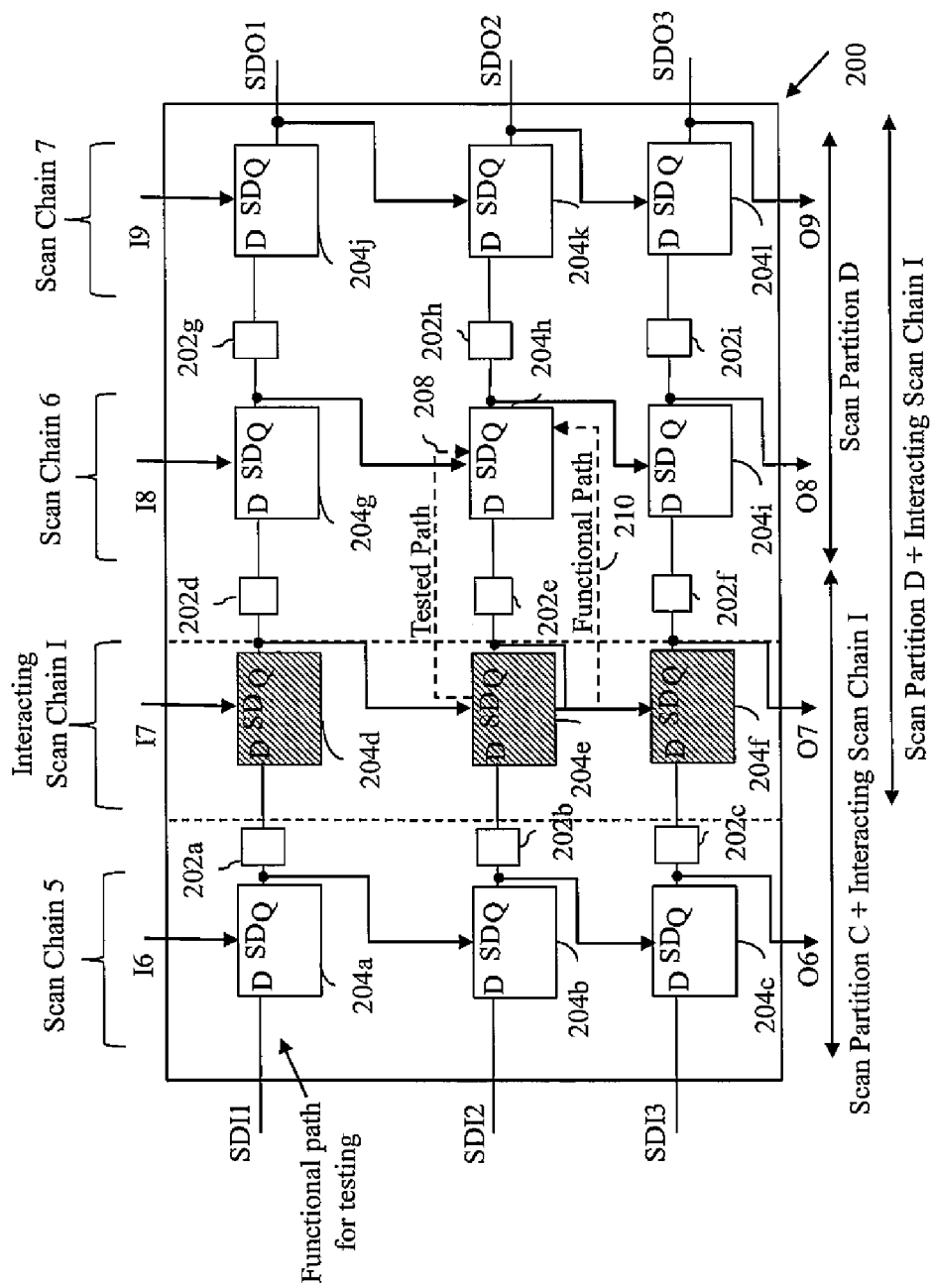
FIG. 2 is a block diagram illustrating an IC device with circuitry for testing an embedded logic circuit by scan partitioning in accordance with an embodiment of the present invention.

Referring now to FIG. 2, a block diagram illustrating an IC device 200 with circuitry for testing an embedded logic circuit and a plurality of scan registers by scan partitioning in accordance with an embodiment of the present invention is shown. The IC device 200 includes a plurality of logic devices 202a, 202b, 202c, . . . , 202i (collectively 202) and a plurality of scan registers 204a, 204b, . . . , 204l (collectively 204), which together form one or more embedded logic circuits for performing one or more predefined functions. In different embodiments of the invention, the embedded logic circuits include embedded cores or one or more custom logic circuits. In accordance with various embodiments of the invention, the plurality of logic devices 202 and the plurality of scan registers 204 form one or more of a timer, peripheral, interface, serial communication interface (SCI) or any other logic circuitry. For ease of testing and for reducing the complexities associated with testing, the embedded logic circuit illustrated in FIG. 2 is divided into two or more scan partitions, two of which are shown, scan partition C and scan partition D.

Each scan partition includes a plurality of scan registers 204. For instance, in the embodiment shown in FIG. 2, the scan partition C includes scan registers 204a, 204b and 204c, which are stitched together to form a scan chain 5. Similarly, scan partition D includes scan registers 204g, 204h and 204i, which are stitched together to form a scan chain 6. The scan partition D also includes another plurality of scan registers 204j, 204k and 204l that have their input ports connected to the logic devices 202g, 202h, and 202i. The scan registers 204j, 204k and 204l also are stitched together to form a scan chain 7. The stitching together of scan registers includes connecting the output of a scan register to the scan input (SD) of the next scan register of the scan chain. In one embodiment of the present invention, each of the plurality of the scan registers 204 comprises a Mux and a D flip-flop.

The output ports of one or more scan registers of a first scan partition interact with input ports of one or more scan registers of a second scan partition through a plurality of interacting scan registers. In the embodiment illustrated in FIG. 2, the output ports of the scan registers 204a, 204b, and 204c of scan chain 5 of scan partition C are connected to the input ports of the scan registers 204g, 204h, and 204i of scan chain 6 of scan partition D through a plurality of interacting scan registers 204d, 204e, and 204f. In different embodiments of the invention, the connection between the scan partition C and the scan partition D through the plurality of interacting scan registers 204d-204f can also be through one or more logic devices. For instance, in FIG. 2, the connection of scan registers 204a-204c of scan chain 5 with the scan registers 204g-204i of scan chain 6 is through logic devices 202d-202f, as well as through the interacting scan registers 204d-204f. The interacting scan registers 204d-204f are stitched together to form an interacting scan chain I.

In the embodiment shown in FIG. 2, the scan registers and the logic devices also are connected in series to form a functional path. A logic data input SDI1 provides input logic data to the first scan register 204a and a first logic data output SDO1 provides serial data out from the last scan register 204j of the functional path 206. Similarly, logic data inputs SDI2 and SDI3 provide input logic data to the scan registers 204b and 204c and logic data outputs SDO2 and SDO3 provide serial data out from the scan registers 204k and 204l of the other functional paths of the embedded logic circuit of the IC device 200. The functional path 206 has internal connections such that the output of each of the logic devices is received at the input of the next scan register and the output of the scan register is input to the next logic device of the functional path.

Further, as illustrated in FIG. 2, a scan data input I6 provides input scan data to scan register 204a of the scan chain 5 and scan data output O6 provides scan data out from the last scan register 204c of scan chain 1. Similarly, scan data inputs I7, I8, and I9 provide input scan data to the first scan registers 204d, 204g and 204j and scan data outputs O7, O8, and O9 provide scan out from the scan registers 204f, 204i and 204l of their respective scan chains.

FIG. 2 also illustrates a tested path 208, which is tested at the interface between scan partitions C and D. A functional path 210 also is shown. The tested path 208 and the functional path 210 are the same and hence there is no loss of transition coverage between scan partitions C and D.

Figure 3:
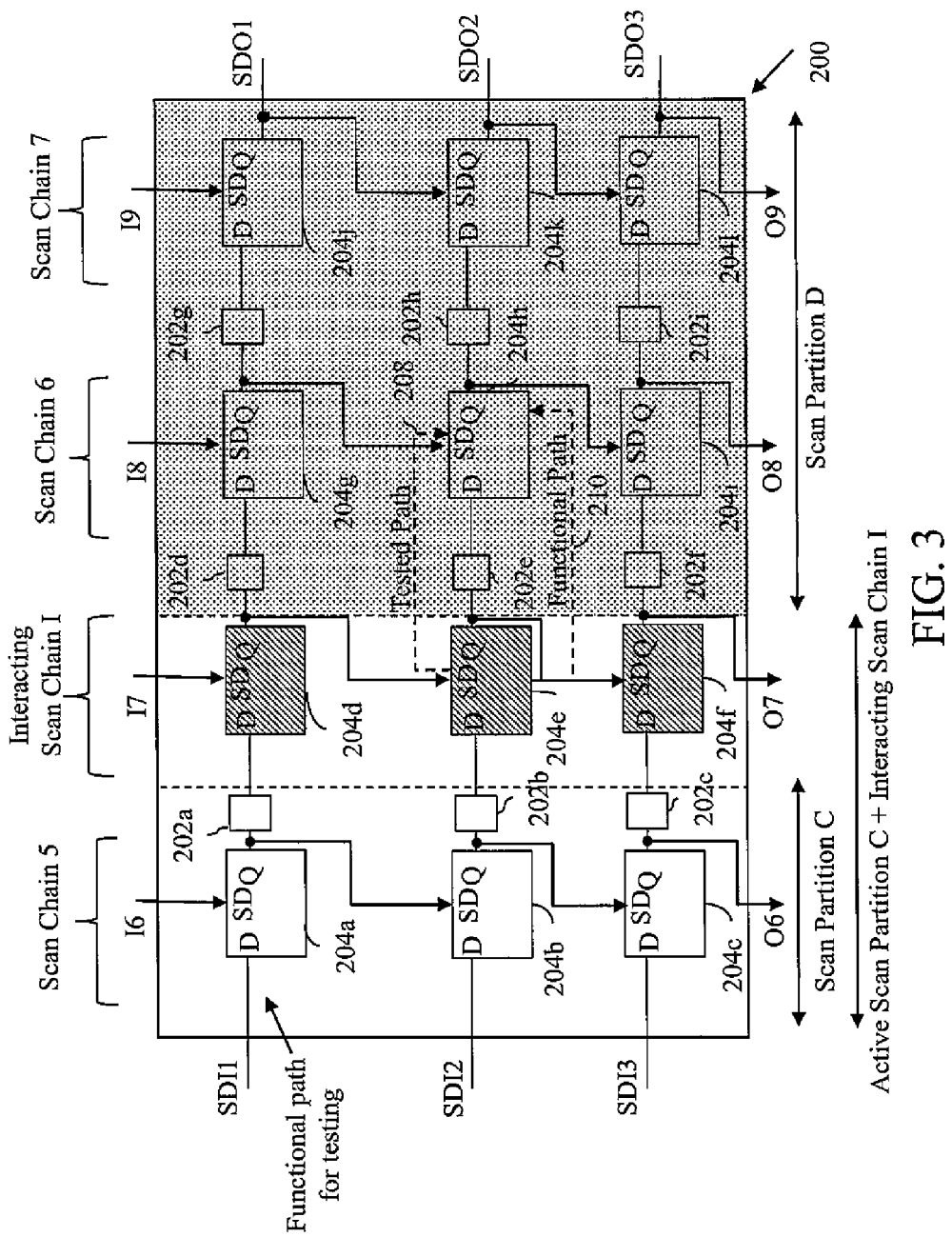
FIG. 3 is a block diagram illustrating the testing of the embedded logic circuit by scan partitioning in a first mode in accordance with an embodiment of the present invention.

FIG. 3 is a block diagram illustrating the testing of the embedded logic circuit and a plurality of scan registers of the IC device 200 in a first test mode. In the first test mode, the scan chain of scan partition C and the interacting scan chain are enabled and the remaining scan chains are not enabled. The area covered by the active scan chains is unshaded and the area covered by the inactive scan chains is shaded. The interacting scan chain registers 204d-204f also are separately shaded. In the first test mode, faults associated with the logic devices and the scan registers of scan partition C are tested, and faults associated with the interacting scan chain are partially tested, while faults associated with scan partition D are untested.

Figure 4:
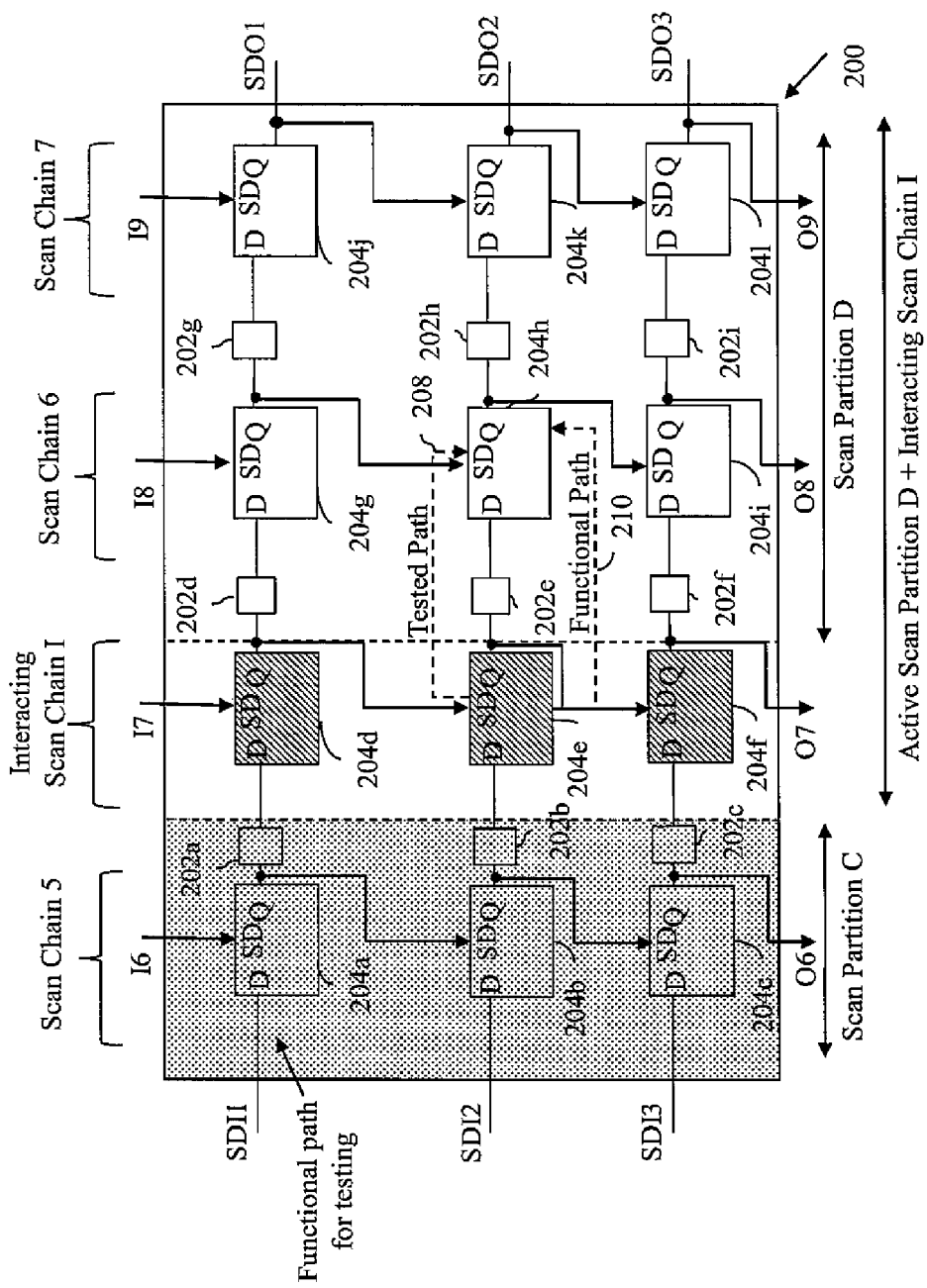
FIG. 4 is a block diagram illustrating the testing of the embedded logic circuit by scan partitioning in a second mode in accordance with an embodiment of the present invention.

FIG. 4 is a block diagram illustrating the testing of the embedded logic circuit and a plurality of scan registers of the IC device 200 in a second test mode. In the second test mode, the interacting scan chain and the scan chains of scan partition D are enabled and other scan chains, including scan chain 5 of scan partition C are not enabled. The area covered by the active scan chains is unshaded and the area covered by the inactive scan chains is shaded. In the second test mode, the faults associated with the logic devices and the scan registers of scan partition D and the remaining faults associated with interacting scan registers of the interacting scan chain I (not tested in the first test mode) are tested. In accordance with the embodiment of the present invention, testing of the entire embedded logic circuit of the IC device 200 is complete at the end of the second test mode, where the logic devices and the scan registers of scan partitions C and D and the interacting scan registers are tested for all kinds of faults. In another embodiment of the invention, the logic devices and the scan registers of successive scan partitions are tested in one or more test modes and the testing of the entire embedded logic circuit is complete at the end of the last one of the one or more test modes.

Figure 5:
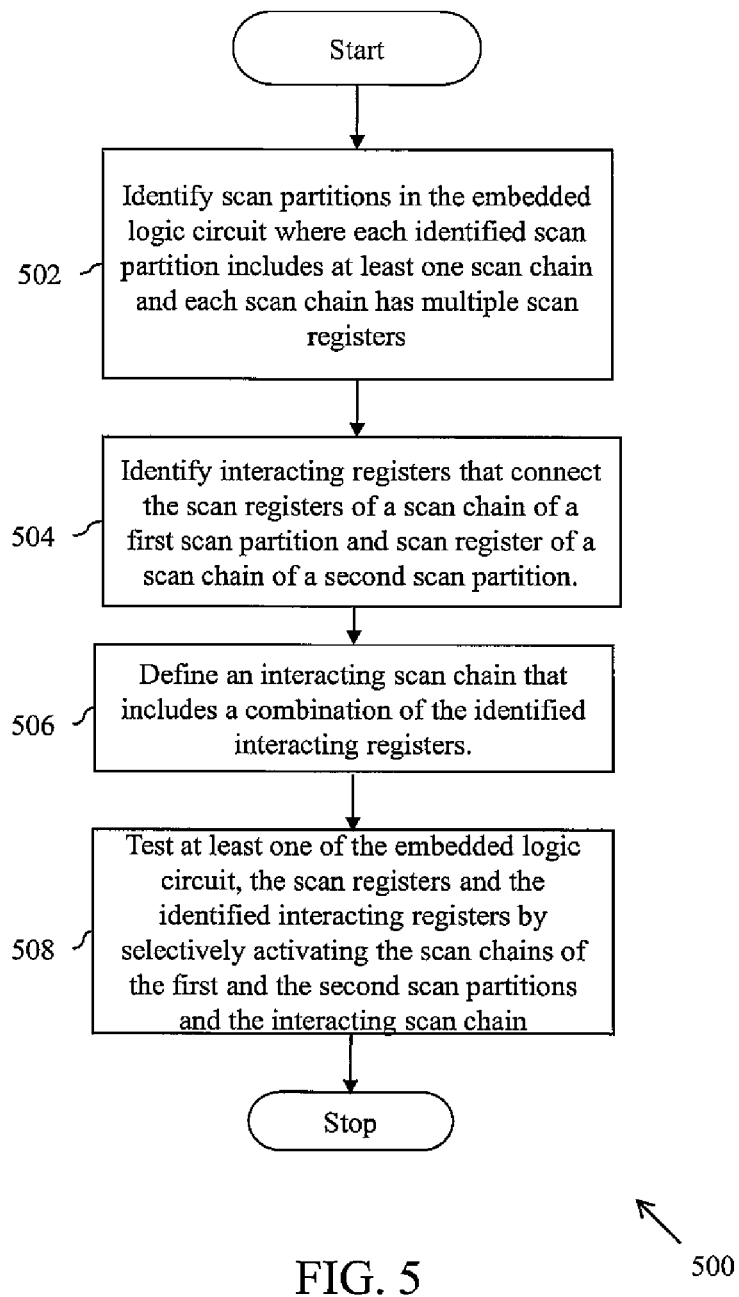
FIG. 5 is a flow chart illustrating the method of scan partitioning for testing an embedded logic circuit in an IC device in accordance with an embodiment of the present invention.

FIG. 5 is a flow chart illustrating a method of scan partitioning for testing an embedded logic circuit and a plurality of scan registers in an IC device in accordance with an embodiment of the present invention. At step 502, one or more scan partitions in the embedded logic circuit are identified. For example, in the embodiment illustrated in FIG. 2, the identified scan partitions are scan partitions C and D. Each of the identified scan partitions includes at least one scan chain such as scan chain 5 for scan partition C, and each of the scan chains further includes one or more scan registers (e.g., scan registers 204a-204c for scan chain 5 of scan partition C). At step 504, one or more interacting scan registers that connect the scan partitions (e.g., such as scan partitions C and D of FIG. 2), are identified. At step 506, an interacting scan chain (e.g., scan chain I of FIG. 2) is identified such that the interacting scan chain includes a combination of the interacting scan registers identified in the step 504. At step 508, at least one of the plurality of logic devices, the scan registers and the interacting scan registers is tested by selectively activating the scan chains of the scan partitions, as was discussed above with reference to FIGS. 3 and 4.

The method and the system described above have a number of advantages. Scan partitioning provides an advantage when fewer I/O ports are available for testing in an embedded logic circuit. It also helps in avoiding long simulation run time that occurs due to large Silicon on Chip (SoC) sizes. The scan partitioning methodology also helps avoid testing problems associated with the integration of third-party Intellectual Properties (IPs). The method and system for scan partitioning discussed above eliminates the use of redundant logic blocks for scan wrappers without impacting the test quality, functional path timing, and IC device area. Further, the methodology provides enhanced test quality, particularly in complex SoC devices, resulting in reduced test escapes. This is also useful in high-speed designs for implementing scan partitioning as there is no additional logic in the functional path. Coverage loss between two or more scan partitions is avoided and hence true transition coverage can be achieved while eliminating additional logic.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

What is claimed is:

1. A method of scan partitioning for testing an embedded logic circuit in an integrated circuit (IC) device, the method comprising:
    identifying one or more scan partitions in the embedded logic circuit, wherein each of the identified scan partitions comprises at least one scan chain, wherein each of the at least one scan chain comprises a plurality of scan registers;
    identifying one or more interacting registers connecting the scan registers of a scan chain of a first scan partition and a scan chain of a second scan partition;
    defining an interacting scan chain comprising a combination of the identified interacting registers; and
    testing at least one of the embedded logic circuit, the plurality of scan registers and the identified interacting registers by selectively activating the scan chains of the first and the second scan partitions and the interacting scan chain,
    wherein testing the embedded logic circuit comprises testing the embedded logic circuit in the first scan partition by activating the at least one scan chain of the first scan partition and the interacting scan chain.

2. The method of claim 1, wherein each of the plurality of scan registers comprises a flip-flop.

3. A method of scan partitioning for testing an embedded logic circuit in an integrated circuit (IC) device, the method comprising:
    identifying one or more scan partitions in the embedded logic circuit, wherein each of the identified scan partitions comprises at least one scan chain, wherein each of the at least one scan chain comprises a plurality of scan registers;

identifying one or more interacting registers connecting the scan registers of a scan chain of a first scan partition and a scan chain of a second scan partition;

defining an interacting scan chain comprising a combination of the identified interacting registers; and testing at least one of the embedded logic circuit, the plurality of scan registers and the identified interacting registers by selectively activating the scan chains of the first and second scan partitions and the interacting scan chain, and wherein testing the plurality of scan registers further comprises testing the scan registers of the at least one scan chain of the first scan partition, and wherein testing the plurality of scan registers of the at least one scan chain of the first scan partition comprises activating the at least one scan chain of the first scan partition and the interacting scan chain.

4. A method of scan partitioning for testing an embedded logic circuit in an integrated circuit (IC) device, the method comprising:

identifying one or more scan partitions in the embedded logic circuit, wherein each of the identified scan partitions comprises at least one scan chain, wherein each of the at least one scan chain comprises a plurality of scan registers;

identifying one or more interacting registers connecting the scan registers of a scan chain of a first scan partition and a scan chain of a second scan partition;

defining an interacting scan chain comprising a combination of the identified interacting registers; and testing at least one of the embedded logic circuit, the plurality of scan registers and the identified interacting registers by selectively activating the scan chains of the first and the second scan partitions and the interacting scan chain, wherein testing the plurality of scan registers comprises testing the scan registers of the interacting scan chain.

5. The method of claim 4, wherein testing the plurality of scan registers of the interacting scan chain comprises activating the interacting scan chain and the at least one scan chain of the second scan partition.

* * * * *